(12) United States Patent
Kawazoe et al.

(10) Patent No.: US 11,634,833 B2
(45) Date of Patent: Apr. 25, 2023

(54) PRODUCTION METHOD OF MONOCRYSTALLINE SILICON BASED ON AN EMISSIVITY OF A PRODUCTION APPARATUS

(71) Applicant: SUMCO CORPORATION, Tokyo (JP)

(72) Inventors: Shinichi Kawazoe, Nagasaki (JP); Toshirou Kotooka, Nagasaki (JP); Yuuji Tsutsumi, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 17/530,535

(22) Filed: Nov. 19, 2021

(65) Prior Publication Data

US 2022/0162769 A1 May 26, 2022

(30) Foreign Application Priority Data

Nov. 25, 2020 (JP) .............................. JP2020-194828

(51) Int. Cl.
| | |
|---|---|
| *C30B 15/20* | (2006.01) |
| *C30B 15/02* | (2006.01) |
| *C30B 35/00* | (2006.01) |
| *C30B 15/10* | (2006.01) |
| *C30B 29/06* | (2006.01) |

(52) U.S. Cl.
CPC .............. *C30B 15/02* (2013.01); *C30B 15/10* (2013.01); *C30B 29/06* (2013.01); *C30B 35/00* (2013.01)

(58) Field of Classification Search
CPC ......... C30B 15/00; C30B 15/02; C30B 15/04; C30B 15/10; C30B 15/20; C30B 15/203; C30B 29/00; C30B 29/02; C30B 29/06; C30B 35/00; C30B 35/002

USPC .... 117/11, 13–15, 19, 21, 35, 928, 931–932
See application file for complete search history.

(56) References Cited

U.S. PATENT DOCUMENTS 10,066,313 B2  9/2018  Hamada et al.

FOREIGN PATENT DOCUMENTS

| JP | 3564740 B2 | | 9/2004 |
|---|---|---|---|
| JP | 2006-36572 A | | 2/2006 |
| JP | 2006036572 A | * | 2/2006 |
| JP | 2010-18499 A | | 1/2010 |

OTHER PUBLICATIONS

Nakamura, K. et al., "The Effect of Impurities on the Grown-in Defects in Cz—Si Crystals", Nov. 2003.
Okumura, T., "Impurity Doping in Semiconductors", Applied Physics 68 (9), Jun. 11, 1999, pp. 1054-1059, together with an English-language translation.

* cited by examiner

*Primary Examiner* — Kenneth A Bratland, Jr.
(74) *Attorney, Agent, or Firm* — Greenblum & Bernstein P.L.C.

(57) ABSTRACT

A production method of monocrystalline silicon includes: measuring an emissivity of an inner wall surface of a top chamber; and determining a target resistivity of monocrystalline silicon based on the emissivity measured in the measuring, thereby producing the monocrystalline silicon. In determining the target emissivity on a crystal center axis at a position for starting formation of a straight body of the monocrystalline silicon in the producing, when the emissivity is 0.4 or less, the target resistivity is determined to be less than a resistivity value of 3.0 mΩ·cm when the dopant is arsenic.

8 Claims, 8 Drawing Sheets

PRODUCTION METHOD OF MONOCRYSTALLINE SILICON BASED ON AN EMISSIVITY OF A PRODUCTION APPARATUS

The entire disclosure of Japanese Patent Application No. 2020-194828 filed Nov. 25, 2020 is expressly incorporated by reference herein.

TECHNICAL FIELD

The present invention relates to a production method of producing monocrystalline silicon by Czochralski method (abbreviated as "CZ method" hereinafter).

BACKGROUND ART

A low/mid voltage power MOSFET (Metal Oxide Semiconductor Field Effect Transistor), which is used as an electric-power device of a mobile device, has a predetermined intrinsic electric resistance (referred to as an "on-resistance" hereinafter) between a drain and a source when being powered on. Accordingly, the low/mid voltage power MOSFET by itself consumes power according to electric currents flowing therein while being powered on.

Thus, the consumption power of the mobile device can be reduced if the on-resistance of the low/mid voltage power MOSFET can be reduced. Given such a background, there is a strong demand for monocrystalline silicon of low electric resistivity (referred simply as "resistivity" hereinafter) among device manufacturers in order to reduce the on-resistance of the low/mid voltage power MOSFET.

In order to grow the monocrystalline silicon of low resistivity by the CZ method, it is necessary to add a high concentration of an n-type dopant, whose typical examples are arsenic (As), phosphorus (P) and antimony (Sb), to a silicon melt stored in a quartz crucible provided in a monocrystalline silicon production machine. An example of the phosphorus (P) to be added is red phosphorus.

Specific resistivity of an n-type monocrystalline silicon required to produce the low/mid voltage power MOSFET is from 1.5 mΩ·cm to 25 mΩ·cm for an n-type dopant in a form of arsenic (As), from 0.5 mΩ·cm to 25 mΩ·cm for the n-type dopant in a form of phosphorus (P), and from 8 mΩ·cm to 40 mΩ·cm for the n-type dopant in a form of antimony (Sb).

In the CZ method, the monocrystalline silicon is produced by pulling up the monocrystalline silicon from the silicon melt. During the production process, oxygen ($O_2$), which is eluted from the quartz crucible primarily made of silicon dioxide ($SiO_2$), reacts with the silicon melt to generate silicon oxide(s) ($Si_xO_y$) ($0<x\leq 2$, $1\leq y\leq 2$). The silicon oxide(s) ($Si_xO_y$) evaporates from a surface of the silicon melt.

Further, as described above, the n-type dopant is added to the silicon melt when the monocrystalline silicon of low resistivity is grown. The n-type dopant has a boiling point lower than the melting point of silicon (Si). Accordingly, an oxide of the n-type dopant is likely to evaporate from a surface of a dopant-added melt (i.e. the silicon melt added with the n-type dopant) during the production process of the monocrystalline silicon. The silicon oxide(s) ($Si_xO_y$) and the oxide of the n-type dopant evaporating from the surface of the silicon melt or the surface of the dopant-added melt will be collectively referred to as "evaporant."

The evaporant reaches an inner wall surface of a top chamber located above the surface of the silicon melt or the dopant-added melt, and a part of the evaporant is adhered to the inner wall surface. When the evaporant is adhered to the inner wall surface of the top chamber, an emissivity ε of the inner wall surface of the top chamber decreases.

The emissivity ε is an index showing efficiency for a surface of an object to emit a thermal energy. The emissivity ε of a certain object is defined as a ratio of radiation emitted from a surface of the object to radiation emitted from a surface of a perfect black body at the same temperature. The emissivity ε is a value ranging from 0 to 1 and is measured in accordance with ASTM C1371. The radiation herein is an infrared radiation whose wavelength ranges from 0.77 μm to 1,000 μm.

When the emissivity ε of the inner wall surface of the top chamber decreases, more heat is supplied from the inner wall surface of the top chamber to the monocrystalline silicon pulled up in the chamber, making it difficult to cool the monocrystalline silicon. A temperature gradient G (degrees C./mm) at a solid/liquid interface in a pull-up axis direction of the monocrystalline silicon (simply referred to as "temperature gradient G" hereinafter) is thus reduced. The temperature gradient G is an important factor for keeping a stable shape of the monocrystalline silicon and controlling internal defects of the monocrystalline silicon.

One of the defects is COP (Crystal Originated Particle). The COP is a defect generated by aggregation of vacancies incorporated in crystalline lattices near the solid/liquid interface while the monocrystalline silicon is grown.

It is known that, when a ratio V/G (a ratio of a pull-up speed V (mm/min) of the monocrystalline silicon to the temperature gradient G) exceeds a critical value, the vacancies become excessive in the silicon single crystal, and the vacancies aggregate to generate COP. As described above, when the emissivity ε of the inner wall surface of the top chamber is lowered by the adhered evaporant, the temperature gradient G, which is a denominator of the ratio V/G, is increased, so that the COP is likely to be generated inside the monocrystalline silicon.

Consequently, a large number of LPD (Light Point Defect) derived from the COP are detected in silicon wafers sliced from the monocrystalline silicon, in which a large number of COP are generated.

The LPD is a defect observed as a bright point when a surface of a silicon wafer is irradiated with laser using a light scattering particle counter. Particles adhered on a surface of a silicon wafer and defects (pits) such as protrusions and dents present on the surface of silicon wafer are detected as the LPD since irradiated laser beam scatters.

In view of the above, it is necessary to take some measures for preventing the emissivity ε of the top chamber inner wall surface from being lowered in order to reduce the LPD failure on the silicon wafer.

In this regard, when the monocrystalline silicon production machine is opened each time a single production batch of pulling up the monocrystalline silicon is completed, deposits adhered to the inner wall surface of the chamber including the top chamber are removed through a cleaning process using a brush and the like. However, the effect of this cleaning process varies depending on the skill of the worker. In addition, the deposits not completely removable by the cleaning process accumulate on the inner wall surface of the top chamber as the production batch is repeated. The emissivity ε of the inner wall surface of the top chamber decreases for these reasons as the production batch is repeated.

Proposals have been made to produce the monocrystalline silicon depending on the emissivity ε of the inner wall surface of the chamber including the top chamber, as disclosed in, for instance, Patent Literature 1 (Japanese Patent No. 3564740), Patent Literature 2 (JP 2006-36572 A), and Patent Literature 3 (JP 2010-18499 A).

Patent Literature 1 (Claims) discloses a monocrystalline silicon production machine, in which the emissivity ε of an inner wall surface of a main chamber is 0.3 or less and the emissivity ε of an inner wall surface of the pull chamber is 0.7 or more.

Patent Literature 2 (paragraphs 0027 and 0028 and FIG. 6) discloses that, when the emissivity ε of an inner circumferential surface of an upper wall of a main chamber is set approximately from 0.3 to 0.5, an optimum pull-up speed for producing a desired monocrystalline silicon can be set approximately from 0.46 to 0.48 mm/min.

Patent Literature 3 (Claim 1 and paragraph 0032) discloses a technique of changing a distance between the surface of the silicon melt and a heat shield member located in a manner facing the surface of the silicon melt, according to a temporal change in the emissivity ε of the inner wall surface of the chamber.

However, the related arts disclosed in Patent Literatures 1 and 2 cannot deal with a case where the emissivity ε declines beyond the set range.

The related art disclosed in Patent Literature 3 cannot deal with a case where the emissivity ε declines beyond the range that can be dealt with by changing the distance between the surface of the silicon melt and the heat shield member.

SUMMARY OF THE INVENTION

An object of the invention is to provide a production method of monocrystalline silicon capable of reducing LPD on a silicon wafer derived from an emissivity ε of an inner wall surface of a top chamber.

In order to achieve an object of the invention, a production method of monocrystalline silicon according to an aspect of the invention uses a monocrystalline silicon production machine including: a crucible configured to store a dopant-added melt including a silicon melt added with an n-type dopant in a form of arsenic, phosphorus, or antimony; a main chamber that houses the crucible; and a top chamber that covers an upper side of the main chamber, in which a resistivity of the monocrystalline silicon is from 1.5 mΩ·cm to 25 mΩ·cm when the dopant is arsenic, from 0.5 mΩ·cm to 25 mΩ·cm when the dopant is phosphorus, and from 8 mΩ·cm to 40 mΩ·cm when the dopant is antimony, the method including: measuring an emissivity of an inner wall surface of the top chamber; and determining a target resistivity of the monocrystalline silicon based on the emissivity measured in the measuring, thereby producing the monocrystalline silicon, in which, in determining the target emissivity on a crystal center axis at a position for starting a formation of a straight body of the monocrystalline silicon in the producing, when the emissivity is equal to or less than a first reference value, the target resistivity is determined to be less than a predetermined set resistivity.

A production method of monocrystalline silicon according to another aspect of the invention uses a monocrystalline silicon production machine including: a crucible configured to store a dopant-added melt including a silicon melt added with an n-type dopant in a form of arsenic, phosphorus, or antimony; a main chamber that houses the crucible; and a top chamber that covers an upper side of the main chamber, in which a resistivity of the monocrystalline silicon is from 1.5 mΩ·cm to 25 mΩ·cm when the dopant is arsenic, from 0.5 mΩ·cm to 25 mΩ·cm when the dopant is phosphorus, and from 8 mΩ·cm to 40 mΩ·cm when the dopant is antimony, the method including: measuring an emissivity of an inner wall surface of the top chamber; and determining a target resistivity of the monocrystalline silicon based on the emissivity measured in the measuring, thereby producing the monocrystalline silicon, in which, in determining the target emissivity on a crystal center axis at a position for starting a formation of a straight body of the monocrystalline silicon in the producing, when the emissivity is more than a first reference value, the target resistivity is determined to be equal to or more than a predetermined set resistivity.

In the production methods of monocrystalline silicon according to the above aspects of the invention, the first reference value of the emissivity is 0.4.

In the production methods of monocrystalline silicon according to the above aspects of the invention, the predetermined set resistivity is 3.0 mΩ·cm when the dopant is arsenic, 1.7 mΩ·cm when the dopant is phosphorus, and 15 mΩ·cm when the dopant is antimony.

In the production methods of monocrystalline silicon according to the above aspects of the invention, the method further includes cleaning the inner wall surface of the top chamber before the measuring.

In the production methods of monocrystalline silicon according to the above aspects of the invention, when the emissivity is less than a second reference value less than the first reference value, the top chamber is replaced or the inner wall surface of the top chamber is polished. The polishing herein is optionally exemplified by chemical polishing as well as mechanical polishing.

In the production methods of monocrystalline silicon according to the above aspects of the invention, the second reference value of the emissivity is 0.2.

According to the above aspects of the invention, the LPD failure on the silicon wafer due to the emissivity ε of the inner wall surface of the top chamber can be reduced.

DESCRIPTION OF EMBODIMENT(S)

As described above, a large number of COP tend to be generated in the monocrystalline silicon grown by the monocrystalline silicon production machine with the decreased emissivity ε of the inner wall surface of the top chamber. Accordingly, it is highly likely that a large number of LPD derived from the COP are detected on a silicon wafer sliced from the monocrystalline silicon. It is thus a typical practice to clean the inner wall surface of the top chamber each time one production batch of the monocrystalline silicon is completed. However, since the deposits not completely removable by the cleaning process accumulate on the inner wall surface of the top chamber as the production batch is repeated, the emissivity ε of the inner wall surface of the top chamber is inevitably decreased.

In order to reduce the LPD failure in the silicon wafer, it is thus necessary to control the monocrystalline silicon production machine so that the monocrystalline silicon is produced according to the gradually decreasing emissivity ε of the inner wall surface of the top chamber.

After dedicated studies, the inventors have found a relationship between the emissivity ε of the inner wall surface of the top chamber and the resistivity of the grown monocrystalline silicon, thereby reaching the invention.

Details on how the invention has been reached will be described below.

Figure 5:
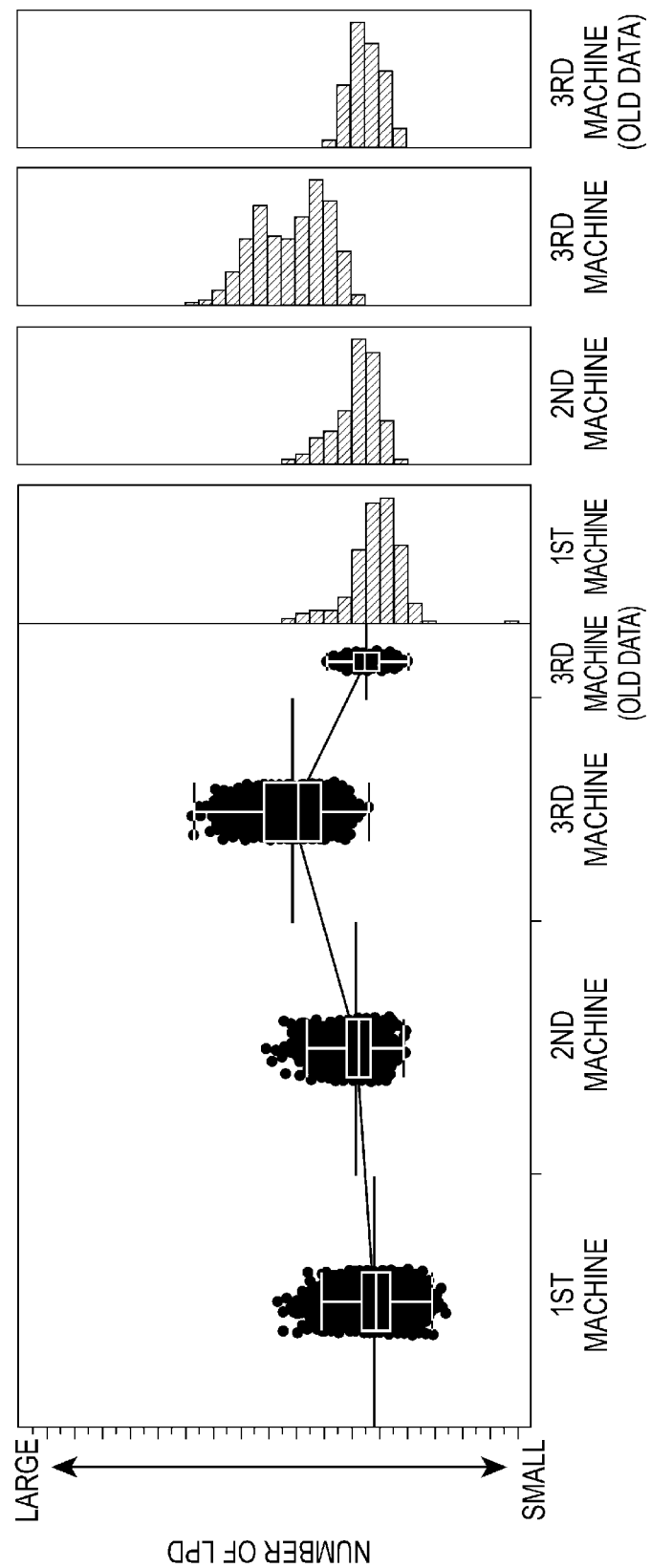
FIG. 5 is a graph showing an example of the number of LPD detected on a silicon wafer sliced from each of ingots of monocrystalline silicon grown using respective monocrystalline silicon production machines.

1. Relationship Between Emissivity ε of Inner Wall Surface of Top Chamber and LPD FIG. 5 is a graph showing an example of the number of LPD (per one silicon wafer) detected in silicon wafers sliced from monocrystalline silicon grown using three monocrystalline silicon production machines. Each of the monocrystalline silicon production machines has the same structure and the same furnace internals. A diameter of the monocrystalline silicon, in which arsenic (As) is doped, is 150 mm. Target resistivity (target resistivity profile) of each of the monocrystalline silicon production machines is from 4.0 mΩ·cm to 6.0 mΩ·cm.

The third machine produces more number of LPD (per one silicon wafer) detected in silicon wafers sliced from the grown monocrystalline silicon as compared with the first and second machines. The "third machine (old version)" in FIG. 5 shows data of the third machine collected several years ago. A comparison of the data of the third machine and the old-version third machine shows that the number of LPD increases due to temporal change even in the same machine. As a result of measurement using an AFM (Atomic Force Microscope), it was found that the LPD was derived from the COP.

Figure 6:
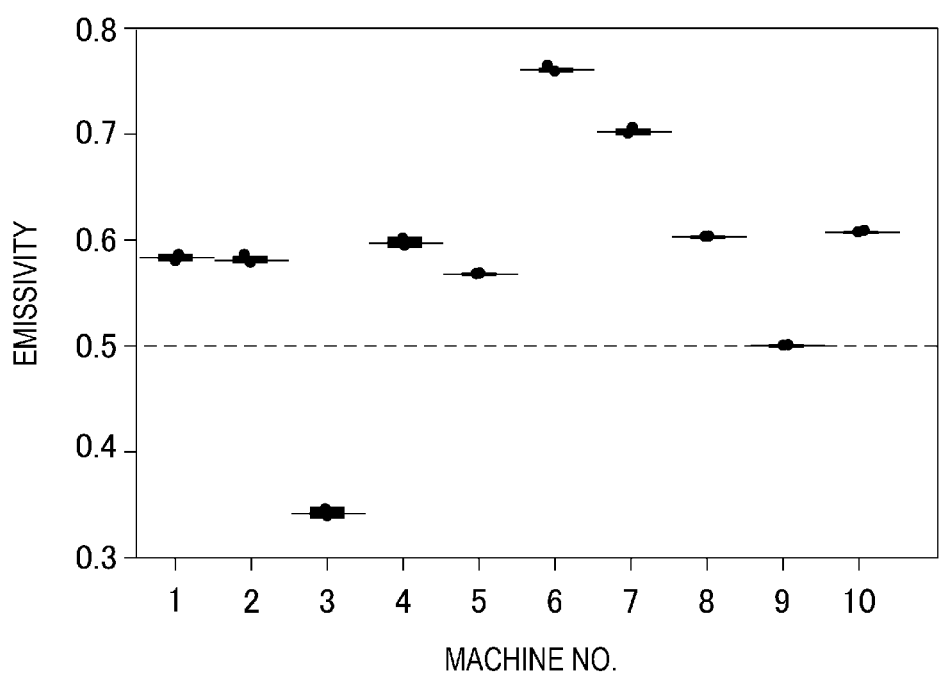
FIG. 6 is a graph showing an example of emissivity ε of an inner wall surface of a top chamber of each of the monocrystalline silicon production machines.

In order to find the reason why the more number of LPD was found in the silicon wafer produced using the third machine, the emissivity ε of the inner wall surface of the top chamber of each of the monocrystalline silicon production machines was measured. FIG. 6 is a graph showing an example of the measurement results of the emissivity ε of the inner wall surface of the top chamber of each of the monocrystalline silicon production machines. It is found from FIG. 6 that only the third machine shows a low emissivity ε of the inner wall surface of the top chamber.

Figure 7:
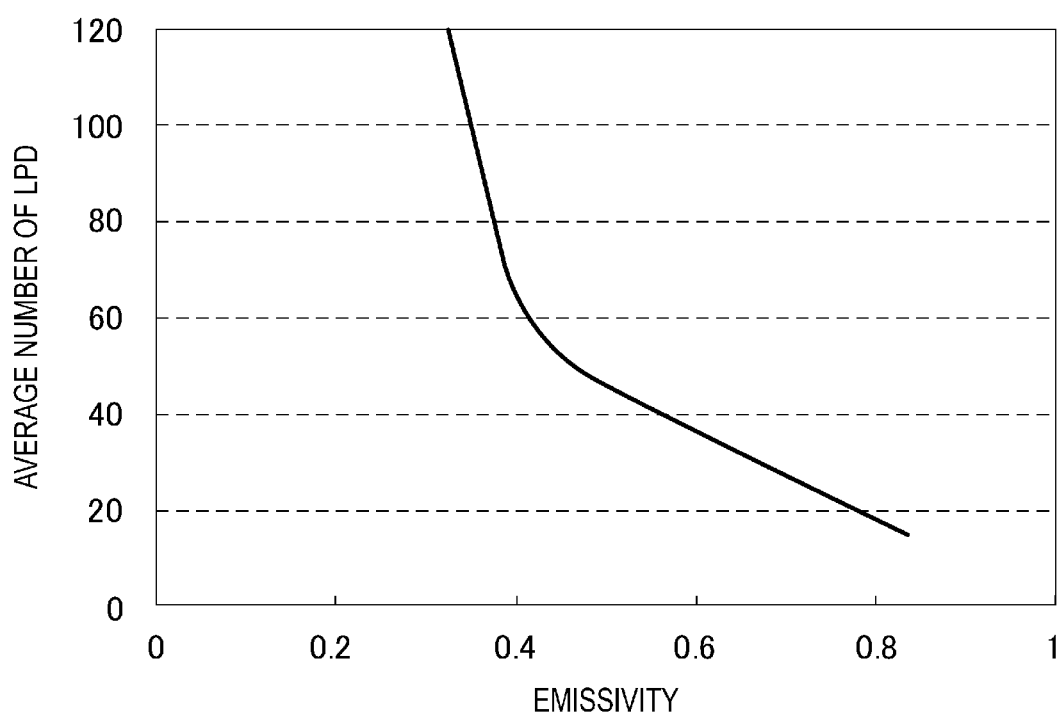
FIG. 7 is a graph showing an example of a relationship between an emissivity ε of the inner wall surface of the top chamber of each of the monocrystalline silicon production machines and the number of LPD detected on each of the silicon wafers sliced from monocrystalline silicon grown using respective monocrystalline silicon production machines.

FIG. 7 shows an example of a relationship between the emissivity ε of the inner wall surface of the top chamber of each of five monocrystalline silicon production machines (including the first to third machines) and the number of LPD detected in the silicon wafers sliced from the monocrystalline silicon grown using respective monocrystalline silicon production machines. In FIG. 7, the "average number of LPD" is an average of the number of LPD whose particle size is 0.145 μm or more per one silicon wafer. It is found from FIG. 7 that the number of LPD increases when the emissivity ε of the inner wall surface of the top chamber is 0.4 or less. It should be noted that the above analysis, which relates to arsenic (As), is also considered to be applied to phosphorus (P) and antimony (Sb).

Based on the above analysis, the inventors have found that, when monocrystalline silicon whose dopant is arsenic (As), phosphorus (P) or antimony (Sb) is grown, the number of LPD derived from COP in a silicon wafer sliced from the monocrystalline silicon increases at 0.4 or less of the emissivity ε of the inner wall surface of the top chamber.

2. Relationship Between Resistivity of Monocrystalline Silicon and LPD

A below-mentioned Reference Literature 1 (pp. 17-18) describes as below.

"1) P and As are elements that introduce vacancies.

2) P or As with a concentration lower than a predetermined concentration increases a total volume of voids. In other words, generation of voids is not restrained.

3) However, P or As with a concentration higher than the predetermined concentration strongly restrains the generation of voids. This is because a) the vacancies are trapped before the voids are generated (e.g. nitrogen reaction) or b) clusters of impurities [Rouvimov et al.], which are generated before the voids are generated, absorb the point defects."

Reference Literature 1:
"The Effect of Impurities on the Grown-in Defects in CZ-Si Crystals, (B, C, N, O, Sb, As, P)", (Kouzou Nakamura et al., 4th The Forum on the Science and Technology of Silicon Material 2003 (Shonan), publicized on Nov. 26, 2003 (Wed.), held by Executive Committee of the Forum on the Science and Technology of Silicon Material)

The inventors studied a relationship between an arsenic (As) concentration measured using SIMS (Secondary Ion Mass Spectrometry) and resistivity of the grown monocrystalline silicon doped with high-concentration arsenic (As) to investigate a relationship between the arsenic (As) concentration and a carrier concentration calculated by the resistivity.

Figure 8:
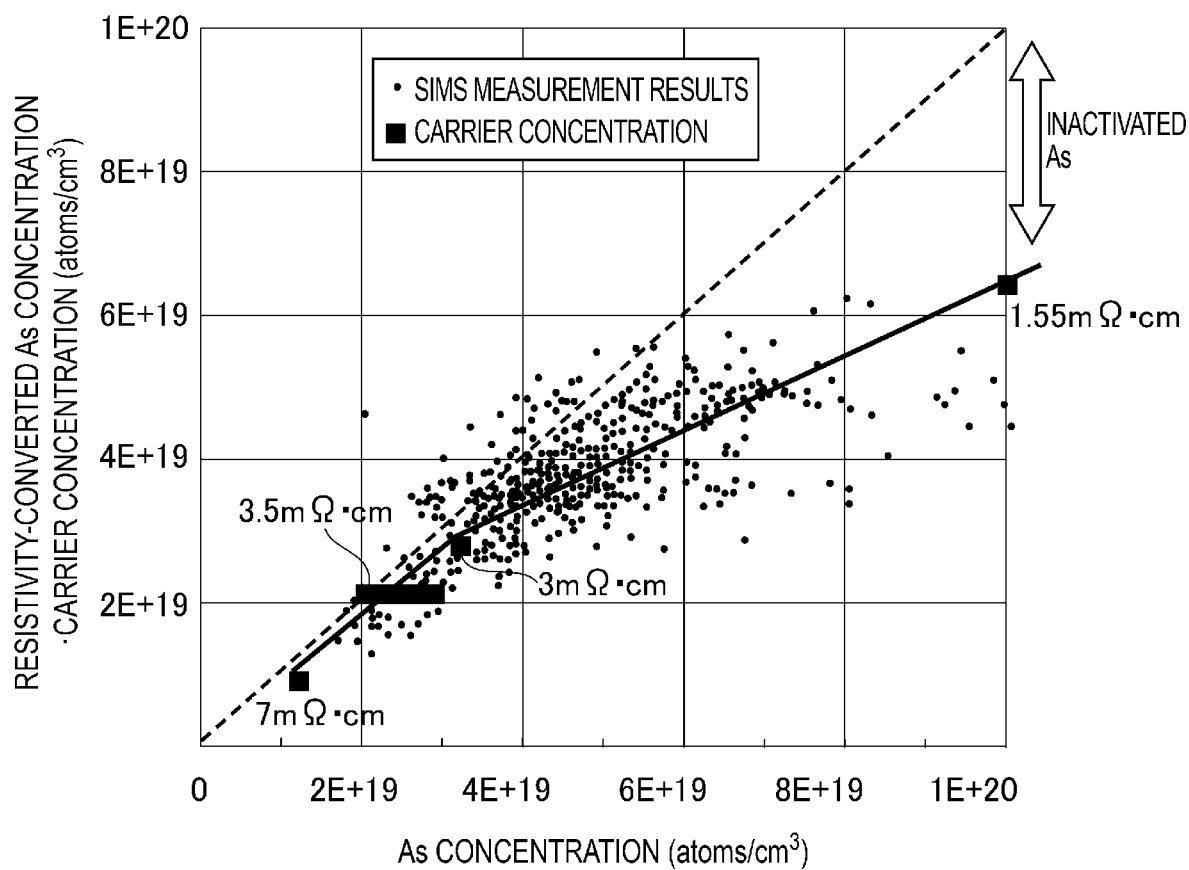
FIG. 8 is a graph showing an example of results of research on a relationship between an arsenic (As) concentration, and an arsenic (As) concentration converted based on resistivity and a carrier concentration.

FIG. 8 shows the results of the investigation on the relationship between the arsenic (As) concentration and the carrier concentration, where the abscissa axis represents measurements of arsenic (As) concentration by SIMS and the ordinate axis shows the arsenic (As) concentration and carrier concentration. In FIG. 8, the arsenic (As) concentration of the ordinate axis is a value obtained by converting the measurements of the resistivity of the monocrystalline silicon according to a procedure described in ASTM F723-99. The carrier concentration (i.e. active dopant concentration) of a sample whose resistivity was known was measured to verify the correctness of the value of the converted arsenic (As) concentration.

In FIG. 8, the dots represent measurements of the arsenic (As) concentration by SIMS and squares represent the carrier concentration. In FIG. 8, the values "1.55 mΩ·cm," "3 mΩ·cm," "3.5 mΩ·cm," and "7 mΩ·cm" each represent the resistivity of the grown monocrystalline silicon.

If all of arsenic (As) doped in the monocrystalline silicon should turn into carriers, the carrier concentration would show characteristics shown by broken lines in FIG. 8. However, the carrier concentration in FIG. 8, which is not plotted on the broken lines, is saturated approximately at $5 \times 10^{19}$ atoms/cm³. In view of the above, it is found that a part of arsenic (As) in the monocrystalline silicon doped with high-concentration arsenic (As) is not turned into carriers (i.e. becomes inactive).

The inventors supposed that the inactivation of the part of arsenic (As) is caused by trapping of the vacancies before the generation of the voids (see 3)a) of the above Reference Literature 1). The solid line shown in FIG. 8, which represents a resistivity region where LPD disappears, substantially coincides with the region where the inactivation of the part of arsenic (As) is started.

As described above, the inventors thought that the LPD failure of the silicon wafer sliced from the monocrystalline silicon doped with high-concentration arsenic (As) might be reduced with the use of the inactivation of a part of arsenic (As). The resistivity region, at which the inactivation of the part of arsenic (As) occurs, is the region of less than 3.0 mΩ·cm in FIG. 8 where the broken line and the solid line are separated. Further, it has been known from the past experience that the number of LPD decreases when the resistivity falls approximately below a range from 2.8 to 3.0 mΩ·cm. Accordingly, the inventors considered that, if the monocrystalline silicon could be grown to have resistivity falling below the above resistivity range, LPD derived from COP would be unlikely to be generated in silicon wafers sliced from the monocrystalline silicon.

In this regard, a below-mentioned Reference Literature 2 (pp. 1057) describes as below. It should be noted that, in the description below, FIG. 6 is similar to FIG. 8 of the present application.

"As schematically shown in FIG. 6, it is known that the carrier density is saturated approximately at $10^{19}$ to $10^{21}$ cm$^{-3}$, though depending on a kind and a conduction type of the semiconductor.

The primary factor for determining the upper limit of the doping concentration is that, when the crystal matrix is doped close to a solid solution limit (i.e. solid solubility of impurity atoms in the crystal matrix)[14], the impurity atoms form clusters or deposits in a form of a solid phase different from the crystal phase of the matrix."

Further, Reference Literature 2 (pp. 1057-1058) describes as below. "Theoretical studies including the first principle calculation have been made for the mechanism of electrically inactivating the clusters[17-19]. FIG. 7 shows two models for inactivation of As donor in silicon. (a) is a model, in which As is bonded to another As in the fourth adjacent position and the bond is recombined as shown in the right figure to be inactivated[19]. In contrast, (b) is a model of forming a complex by four As donors and an atomic vacancy[17], where the atomic positions of As are relaxed toward the vacancy to form a threefold symmetry. What is common to both models is that the angles formed by the remaining three bonds of As are smaller than 109 degrees in the instance shown in FIG. 2. Specifically, p component in the bond becomes strong and s component forms a lone pair to be stabilized."

Reference Literature 2:
"Basic Course <Physics and Design of Semiconductor Material-Process>Impurity Doping to Semiconductor <Basic Edition>," (by Tsugunori Okumura, Applied Physics vol. 68, No. 9, p. 1054 to p. 1059, 1999, published by Japan Society of Applied Physics)

The inventors considered that the mechanism for causing inactivation of the part of arsenic (As) was supported by the model (b) of forming a complex of four As donors and a vacancy described in Reference Literature 2. It should be noted that the above idea, which relates to arsenic (As), is also believed to be applied to phosphorus (P) and antimony (Sb).

Based on the above idea, the inventors have considered that, if monocrystalline silicon whose dopant is arsenic (As), phosphorus (P) or antimony (Sb) should be grown so that the target resistivity falls less than a predetermined set resistivity for each of the dopants, the silicon wafer sliced from the monocrystalline silicon would not be likely to be affected by the decrease in the emissivity ε of the inner wall surface of the top chamber because LPD derived from COP would not be easily generated in the silicon wafer.

Based on the above analysis on the above-described "1. Relationship between Emissivity ε of Inner Wall Surface of Top Chamber and LPD" and the speculation on the above-described "2. Relationship between Resistivity of Monocrystalline Silicon and LPD", the inventors have considered that monocrystalline silicon should be grown as described below in order to reduce the LPD on silicon wafers.

Target resistivity on a crystal center axis at a position for forming a straight body of monocrystalline silicon 2 is determined as follows. Specifically, when the emissivity ε of the inner wall surface of the top chamber is more than 0.4, the target resistivity is determined to be equal to or more than predetermined resistivity set in advance for each of types of the dopant for growing the monocrystalline silicon.

In contrast, when the emissivity is 0.4 or less, the target resistivity on a crystal center axis at a position for starting a straight body of the monocrystalline silicon 2 is determined to be less than the predetermined resistivity set in advance for each of types of the dopant for growing the monocrystalline silicon.

First Exemplary Embodiment

A first exemplary embodiment of the invention will be described below with reference to the attached drawings.

Arrangement of Monocrystalline Silicon Production Machine 1

Figure 1:
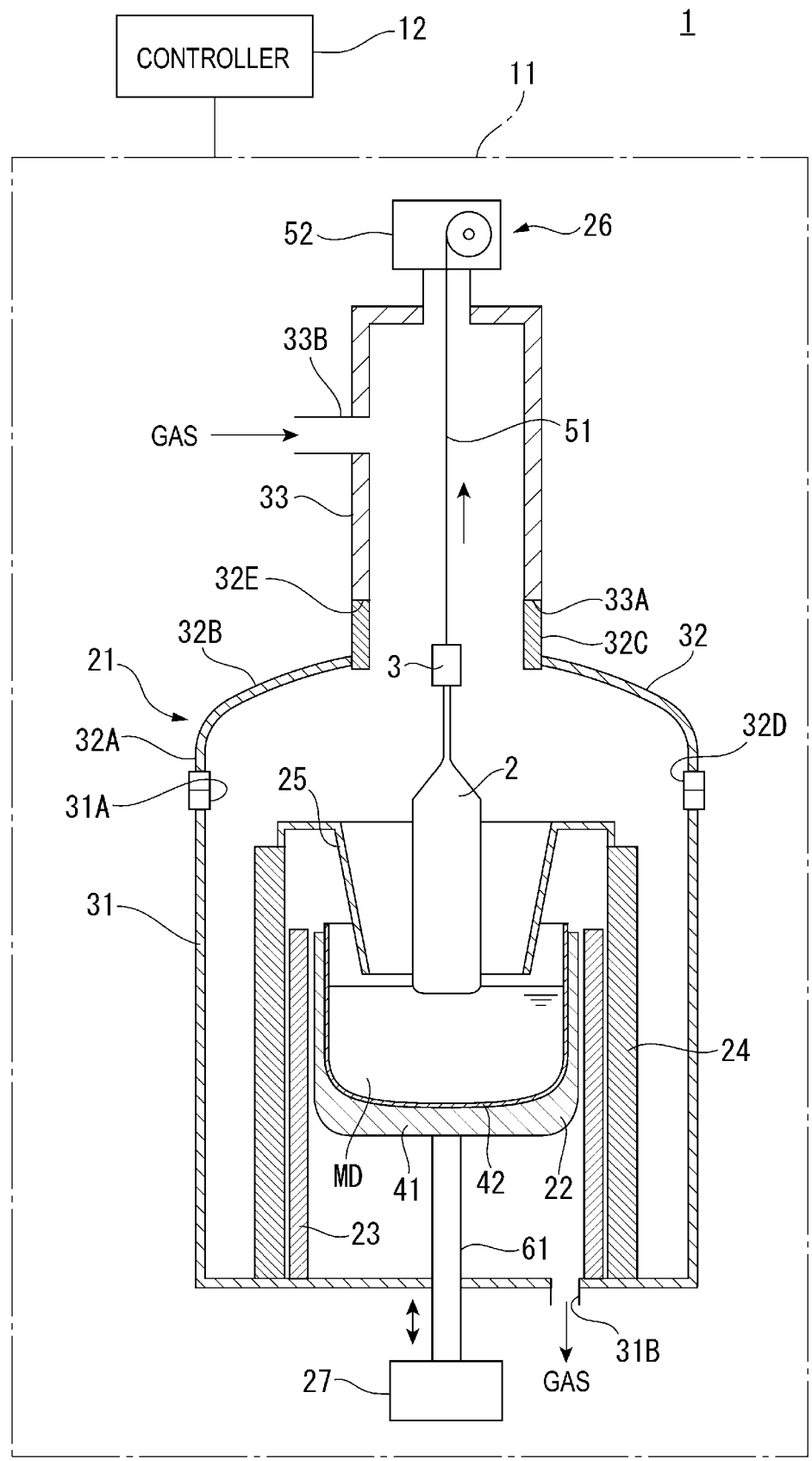
FIG. 1 is a schematic illustration of an exemplary arrangement of a monocrystalline silicon production machine to which a production method of monocrystalline silicon according to a first exemplary embodiment of the invention is applied.

FIG. 1 is a schematic illustration of a monocrystalline silicon production machine 1 usable for a production method of monocrystalline silicon according to the first exemplary embodiment of the invention. The monocrystalline silicon production machine 1 is configured to produce the monocrystalline silicon 2 by the CZ method.

The monocrystalline silicon production machine 1 includes a machine body 11 and a controller 12. The machine body 11 includes a furnace body 21, a crucible 22, a heater 23, a heat insulation material 24, a heat shield 25, a pull-up unit 26, and a crucible driver 27.

The furnace body 21 includes a main chamber 31, a top chamber 32, and a pull chamber 33. The main chamber 31 houses a crucible 22, a heater 23, a heat insulation material 24, and a heat shield 25. The crucible 22, the heater 23, the heat insulation material 24, and the heat shield 25 are collectively referred to as "furnace internals."

The main chamber 31, which is a cylindrical component whose bottom side is closed, is provided with a main opening 31A at an upper end thereof.

As shown in FIG. 1, the top chamber 32 is connected in an airtight manner with the main opening 31A of the main chamber 31 to cover an upper side of the main chamber 31. The top chamber 32 is a hollow component including a lower cylindrical portion 32A, a flattened sphere portion 32B, and an upper cylindrical portion 32C that are integrally connected.

The lower cylindrical portion 32A has a lower opening 32D connected in an airtight manner with the main opening 31A of the main chamber 31. The lower cylindrical portion 32A is a cylindrical component whose diameter is the same as the diameter of the main chamber 31.

The flattened sphere portion 32B has a lower end integrated with an upper end of the lower cylindrical portion 32A and an upper end connected in an airtight manner with the upper cylindrical portion 32C. The flattened sphere portion 32B is a flattened (large-diameter) spherical component that is tapered from a part connected with the lower cylindrical portion 32A to a part connected with the cylindrical upper cylindrical portion 32C.

The upper cylindrical portion 32C has a lower end connected in an airtight manner with the upper end of the flattened sphere portion 32B and an upper end provided with a sub opening 32E.

The pull chamber 33 is a component for temporarily housing pulled-up monocrystalline silicon 2. The pull chamber 33 has a lower opening 33A connected in an airtight manner with the sub opening 32E of the upper cylindrical portion 32C of the top chamber 32. The pull chamber 33 is a cylindrical component whose diameter is the same as the diameter of the upper cylindrical portion 32C.

The main chamber 31, the top chamber 32, and the pull chamber 33 are mutually connected in an airtight manner to define a closed space in the furnace body 21.

A gas inlet 33B for introducing inactive gas (e.g. argon (Ar) gas) into the furnace body 21 is provided at an upper part of the pull chamber 33. A gas outlet 31B for discharging gas inside the furnace body 21 by driving a vacuum pump (not shown) is provided at a lower part of the main chamber 31.

The main chamber 31, the top chamber 32, and the pull chamber 33 of the furnace body 21 are made of, for instance, a stainless steel. Among stainless steels, austenite stainless steel (SUS304) is a suitable material for the furnace body 21 in view of its good balance among mechanical characteristics and excellent corrosion resistance and processability. The inner wall surface of the furnace body 21 is not subjected to any surface treatment (e.g. blackening and mirror-polishing). When the surface is blackened, the coating is peeled off during a cleaning process, causing a large change in emissivity. Meanwhile, the surface-polishing excessively lowers the emissivity. The emissivity ε of the surface of stainless steel against infrared light (wavelength 0.77 μm to 1,000 μm) is from 0.1 to 0.8.

The crucible 22, which is provided in the main chamber 31, stores a dopant-added melt MD (i.e. silicon melt added with a dopant). The crucible 22 includes a support crucible 41 and a quartz crucible 42 received in the support crucible 41. The support crucible 41 is made of, for instance, graphite or carbon-fiber reinforced carbon. A main component of the quartz crucible 42 is silicon dioxide ($SiO_2$).

The heater 23, which is located outside and spaced apart from the crucible 22 by a predetermined distance, is configured to heat the dopant-added melt MD in the crucible 22. The heater 23 is a cylindrical component.

The heat insulation material 24, which is located outside and spaced apart from the heater 23 by a predetermined distance, is configured to keep an internal temperature. The heat insulation material 24 is a cylindrical component made of a carbon material (e.g. graphite).

The heat shield 25, which surrounds the monocrystalline silicon 2 during the production process of the monocrystalline silicon 2, is configured to block radiation heat from the heater 23 to the monocrystalline silicon 2. The heat shield 25 is a substantially truncated cone component that is tapered downward and is flanged at an upper end. At least a surface of the heat shield 25 is made of a carbon material.

The pull-up unit 26 includes a cable 51, to an end of which a seed crystal 3 is attached, and a drive unit 52 for vertical movement and rotation of the cable 51.

The crucible driver 27, which includes a support shaft 61 for supporting the crucible 22 from a lower side, is configured to rotate and vertically move the crucible 22 at a predetermined speed.

The controller 12 is configured to control the components of the machine body 11 based on various kinds of information necessary for producing the monocrystalline silicon 2 stored in an internal memory and an operation of a worker to produce the monocrystalline silicon 2.

Production Method of Monocrystalline Silicon

Figure 3:
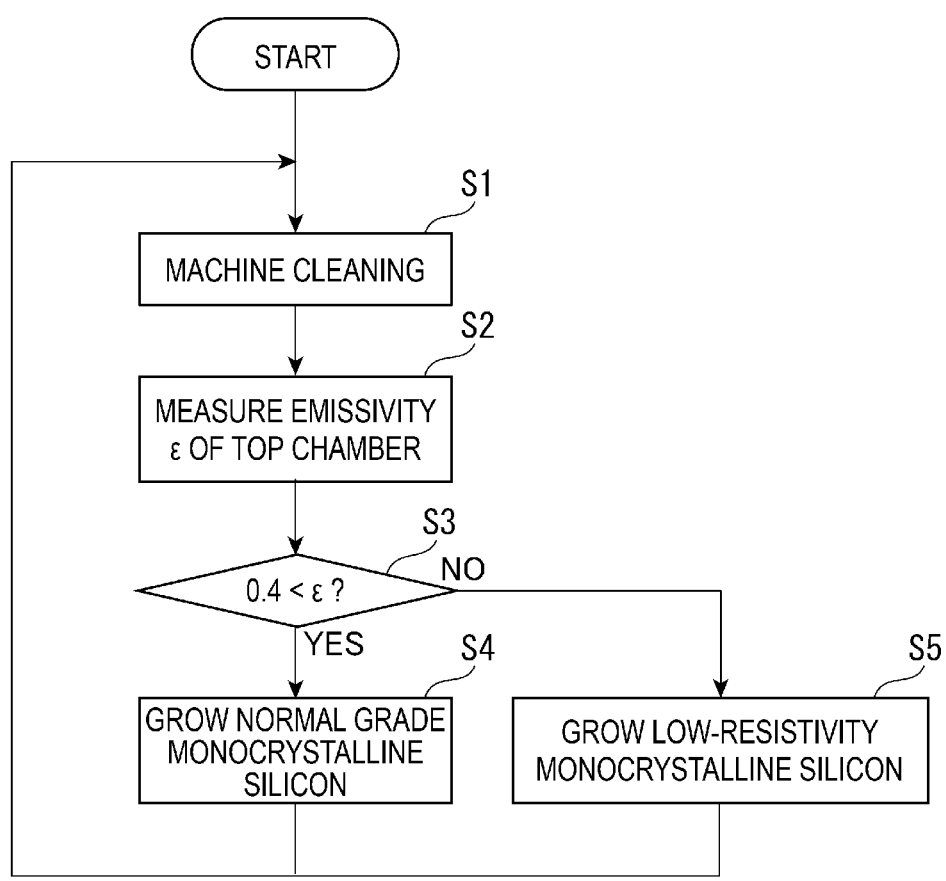
FIG. 3 is a flow chart showing an example of the production method of monocrystalline silicon according to the first exemplary embodiment of the invention.

Next, an example of the production method of the monocrystalline silicon 2 using the monocrystalline silicon production machine 1 that is configured as described above will be described below. FIG. 3 is a flow chart showing an example of the production method of the monocrystalline silicon 2 according to the first exemplary embodiment of the invention.

In the first exemplary embodiment, based on the analysis on "1. Relationship between Emissivity ε of Inner Wall Surface of Top Chamber and LPD" and the speculation on the above-described "2. Relationship between Resistivity of Monocrystalline Silicon and LPD", the grade of the monocrystalline silicon 2 to be grown by the monocrystalline silicon production machine 1 is classified into a normal grade that is likely to be affected by the decrease in the emissivity ε of the inner wall surface of the top chamber 32 and a low-resistivity grade that is unlikely to be affected by the decrease in the emissivity ε of the inner wall surface of the top chamber 32.

The normal grade refers to a grade of the monocrystalline silicon 2 whose target resistivity is from 3.0 mΩ·cm to 25 mΩ·cm when the dopant is arsenic (As), whose target resistivity is from 1.7 mΩ·cm to 25 mΩ·cm when the dopant is phosphorus (P), and whose target resistivity is from 15 mΩ·cm to 40 mΩ·cm when the dopant is antimony (Sb).

In contrast, the low-resistivity grade refers to a grade of the monocrystalline silicon 2 whose target resistivity is 1.5 mΩ·cm or more and less than 3.0 mΩ·cm when the dopant is arsenic (As), whose target resistivity is 0.5 mΩ·cm or more and less than 1.7 mΩ·cm when the dopant is phosphorus (P), and whose target resistivity is 8 mΩ·cm or more and less than 15 mΩ·cm when the dopant is antimony (Sb).

It should be noted that the value of the target resistivity refers to a value of a targeted (aimed) resistivity (=target resistance profile) on a crystal center axis at a position at which formation of the straight body of the monocrystalline silicon 2 is started.

The above explanation is summarized in Table 1. In Table 1, "producible" means that the relevant grade doped with the corresponding dopant is producible when the emissivity ε of the top chamber 32 is within the specified range. For instance, the low-resistivity grade whose dopant is arsenic (As) is producible because the LPD on the silicon wafer does not increase irrespective of the value of the emissivity ε of the inner wall surface of the top chamber 32.

In Table 1, "non-producible" means that, when the emissivity ε of the top chamber 32 is 0.4 or less, the normal grade of the relevant dopant is not produced due to increase in the LPD of the silicon wafer.

TABLE 1

| Dopant | Target Resistivity of Monocrystalline Silicon | | Emissivity ε of Top Chamber | |
|---|---|---|---|---|
| | | | $\epsilon \leq 0.4$ | $0.4 < \epsilon \leq 0.8$ |
| Arsenic | low-resistivity grade | 1.5 mΩ · cm or more and less than 3.0 mΩ · cm | Producible | |
| | normal grade | 3.0 mΩ · cm or more and 25 mΩ · cm or less | Non-Producible | Producible |
| Phosphorus | low-resistivity grade | 0.5 mΩ · cm or more and less than 1.7 mΩ · cm | Producible | |
| | normal grade | 1.7 mΩ · cm or more and 25 mΩ · cm or less | Non-Producible | Producible |
| Antimony | low-resistivity grade | 8 mΩ · cm or more and less than 15 mΩ · cm | Producible | |
| | normal grade | 15 mΩ · cm or more and 40 mΩ · cm or less | Non-Producible | Producible |

In the first exemplary embodiment, as shown in FIG. 3, a worker cleans the monocrystalline silicon production machine 1 before the monocrystalline silicon 2 is pulled up in the next production batch after one production batch of pulling up the monocrystalline silicon 2 is completed (Step S1).

Initially, the worker raises the top chamber 32 and the pull chamber 33 using an elevation mechanism (not shown) to separate the top chamber 32 and the pull chamber 33 from the main chamber 31. Subsequently, after peeling and sucking deposits on the respective inner wall surfaces of the main chamber 31, the top chamber 32, and the pull chamber 33 and after polishing the inner wall surfaces with cleaning utensils (e.g. a brush and vacuum pump), the worker wipes away remaining deposits using a chemical (e.g. alcohol). The worker then peels, sucks, and wipes away the deposits on the inner wall surfaces of the gas outlet 31B and an exhaust pipe connected to the gas outlet 31B and/or polishes the inner wall surfaces.

Subsequently, the worker measures the emissivity ε of several points on the inner wall surface of the flattened sphere portion 32B of the top chamber 32 using, for instance, a radiation thermometer (Step S2). The emissivity ε is measured on the inner wall surface of the flattened sphere portion 32B because, in the inner wall surface of the top chamber 32, the inner wall surface of the flattened sphere portion 32B most significantly affects the heat input to the growing monocrystalline silicon 2. Specific points to be measured are, for instance, eight points symmetrical with respect to a center axis of the top chamber 32 shown by cross marks in FIG. 2. The two points in the radial direction is located at points where the inner wall surface of the flattened sphere portion 32B is divided into three equal parts in the radial direction.

Next, the worker calculates an average of the eight measurements of the emissivity ε measured by the radiation thermometer. The measurement error can thus be reduced. Subsequently, the worker judges whether the average of the emissivity ε exceeds 0.4 (Step S3). When the average of the emissivity ε exceeds 0.4, the worker commands the monocrystalline silicon production machine 1 to grow the monocrystalline silicon 2 of the normal grade. Then, the process returns to Step S1 (Step S4).

In contrast, when the emissivity ε is 0.4 or less, the worker commands the monocrystalline silicon production machine 1 to grow the monocrystalline silicon 2 of the low-resistivity grade. Then, the process returns to Step S1 (Step S5).

As described above, in the first exemplary embodiment, the emissivity ε of the inner wall surface of the top chamber 32 is measured, where, when the emissivity ε exceeds 0.4, the monocrystalline silicon 2 of the normal grade is produced and, when the emissivity ε is 0.4 or less, the monocrystalline silicon 2 of the low-resistivity grade is produced. This is because the monocrystalline silicon 2 of the normal grade is likely to be affected by the decrease in the emissivity ε of the inner wall surface of the top chamber 32, whereas the monocrystalline silicon 2 of the low-resistivity grade is not likely to be affected by the decrease in the emissivity E. The LPD failure in the silicon wafer due to the emissivity ε can be thus reduced irrespective of the grade of the monocrystalline silicon.

Second Exemplary Embodiment

A second exemplary embodiment of the invention will be described below with reference to the attached drawings.
Arrangement of Monocrystalline Silicon Production Control System 100

Figure 4:
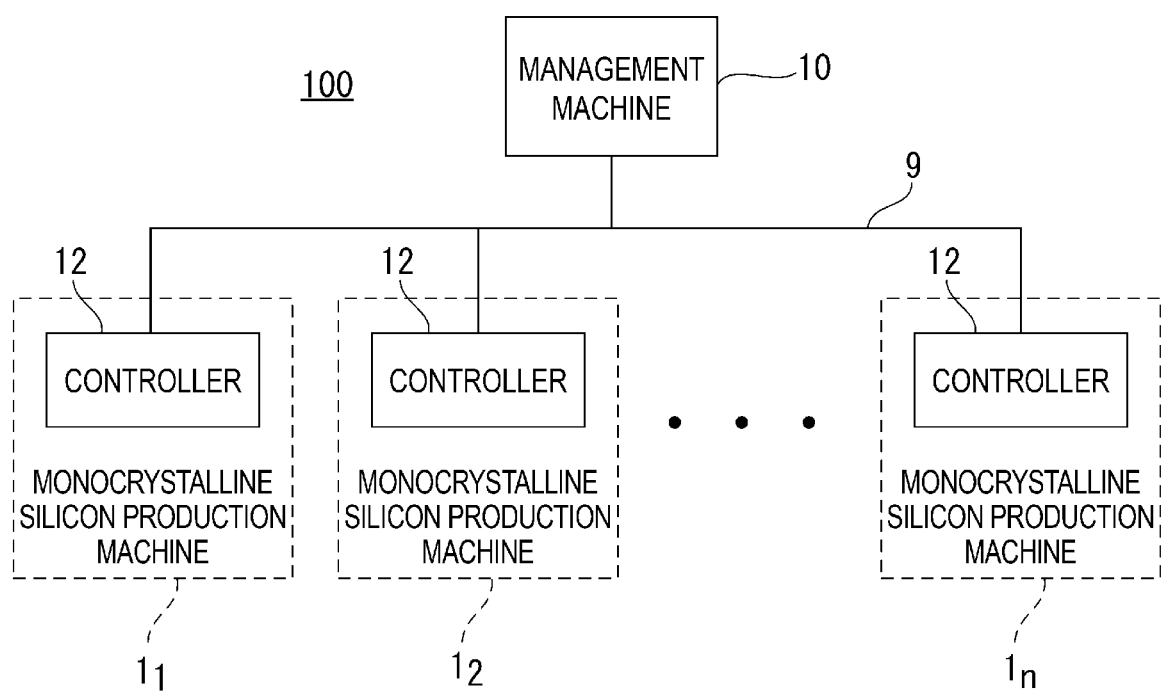
FIG. 4 is a block diagram showing an exemplary arrangement of a monocrystalline silicon production control system according to a second exemplary embodiment of the invention.

FIG. 4 is a block diagram showing an exemplary arrangement of a monocrystalline silicon production control system 100 according to a second exemplary embodiment of the invention. The monocrystalline silicon production control system 100 includes a management machine 10 configured to control the production of monocrystalline silicon 2 in an entirety of a factory and respective controllers 12 of the monocrystalline silicon production machines $1_1$ to $1_n$ (n is a positive integer) connected to the management machine 10 via a network 9.

Figure 2:
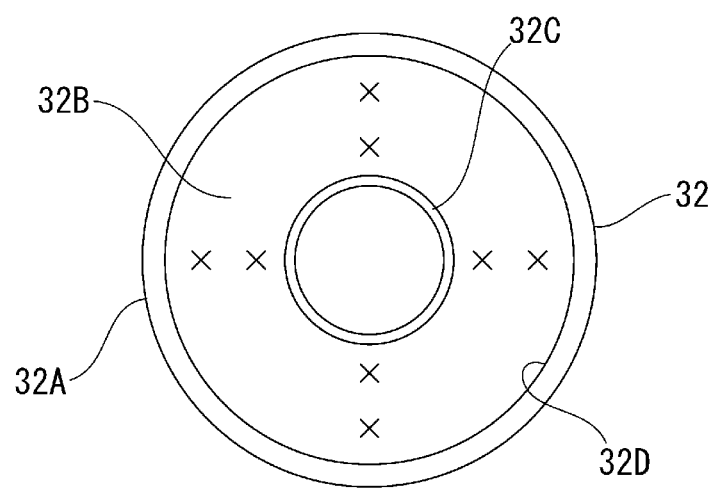
FIG. 2 is a bottom plan view of a top chamber shown in FIG. 1.

Each of the monocrystalline silicon production machines $1_1$ to $1_n$ used in the second exemplary embodiment, which are configured substantially in the same manner as the monocrystalline silicon production machine described in paragraphs 0057 to 0068 with reference to FIGS. 1 and 2 in the first exemplary embodiment, will be described only in a summarized manner and will not be detailed below.

Each of the monocrystalline silicon production machines $1_1$ to $1_n$ includes the machine body 11 and the controller 12. The machine body 11 includes the furnace body 21, the crucible 22, the heater 23, the heat insulation material 24, the heat shield 25, the pull-up unit 26, and the crucible driver 27. The furnace body 21 includes the main chamber 31, the top chamber 32, and the pull chamber 33.

The controller 12, which is configured to produce the monocrystalline silicon 2 as described in the first exemplary embodiment, further includes additional functions as described below. The controller 12, which is connected with the management machine 10 via the network 9, is configured to send various kinds of information (e.g. measured emissivity ε of the inner wall surface of the top chamber 32) to the management machines 10. The controller 12 is configured to store various kinds of information (e.g. production instructions) sent from the management machine 10 in an internal memory and display a part of the information on a display unit (not shown). The production instructions include the grade of the monocrystalline silicon 2 to be produced in the next production batch, the dopant, the target resistivity, the diameter of the straight body, produced time, and the like.

The management machine 10 creates the production instructions based on the emissivity ε of the inner wall surface of the top chamber 32 sent from each of the monocrystalline silicon production machines $1_1$ to $1_n$, various kinds of information (production plan) stored in the internal memory, and an operation of an administrator. The management machine 10 is configured to send the production instructions to the monocrystalline silicon production machines $1_1$ to $1_n$ to produce various types of the monocrystalline silicon 2.

The controller 12 is configured to control relevant components of the machine body 11 to produce the monocrystalline silicon 2 of the grade, the dopant, the target resistivity, and the diameter of the straight body designated by the production instructions at the production time designated by the production instructions.

As described above, the management machine 10 in the second exemplary embodiment, which obtains the emissivity ε of the inner wall surface of the top chamber 32 in each of the monocrystalline silicon production machines $1_1$ to $1_n$, creates the production instructions based on the production plan to send the production instructions to each of the monocrystalline silicon production machines 11 to 1n. Accordingly, the LPD failure on the silicon wafer due to the emissivity ε can be reduced irrespective of the grade of the monocrystalline silicon. In addition, the productivity of the entirety of the factory can be improved.

It should be noted that the specific arrangement of the invention, which is not limited by the exemplary embodiments of the invention described in detail with reference to the attached drawings, encompasses design modifications and the like as long as such modifications are compatible with an object of the invention.

The emissivity ε of the inner wall surface of the top chamber 32, which is exemplarily measured after cleaning the monocrystalline silicon production machine 1 in first exemplary embodiment, is not necessarily measured after cleaning the monocrystalline silicon production machine 1 but is optionally measured when a new top chamber 32 is installed or the furnace body 21 itself is exchanged.

According to the above arrangement, when the emissivity ε of the inner wall surface of the top chamber 32 is less than 0.4 from the start, low-resistivity grade monocrystalline silicon 2 can be grown from the first. Alternatively, when the measurements of the emissivity ε of the inner wall surface of the top chamber 32 are found to be more than 0.4 after replacing only the top chamber 32, normal grade monocrystalline silicon 2 is optionally grown.

The emissivity ε, which is measured at eight points in Step S2 by the worker using the radiation thermometer in the first exemplary embodiment, is not necessarily measured as in the first exemplary embodiment. For instance, the emissivity ε of the eight points is optionally automatically measured by attaching a mechanism, which is configured to slide the radiation thermometer outward in the radial direction in a manner capable for the radiation thermometer to be sequentially located to respective positions below the eight measurement points, to the lower opening 32D. In this case, the mechanism and the measurement of the emissivity ε by the radiation thermometer are optionally controlled by the controller 12.

The emissivity ε, which is measured at eight points in Step S2 by the worker using the radiation thermometer in the first exemplary embodiment, is not necessarily measured as in the first exemplary embodiment. The emissivity ε of the top chamber 32 is optionally measured, for instance, at one point representative of the emissivity ε of the entirety of the top chamber 32. However, the emissivity ε of the top chamber 32 is preferably measured at a plurality of points and the obtained measurements are preferably averaged. The measurement error can thus be reduced.

The scope of the invention is not limited by an example shown in the first exemplary embodiment, where the monocrystalline silicon 2 of the normal grade is produced when the emissivity ε of the inner wall surface of the top chamber 32 is more than 0.4 and the monocrystalline silicon 2 of the low-resistivity grade is produced when the emissivity ε is 0.4 or less. For instance, when the emissivity ε is less than 0.2, judging that even the low-resistivity grade monocrystalline silicon 2 cannot be grown, the furnace body 21 (especially the top chamber 32) itself is optionally replaced or the inner wall surface of the top chamber 32 is optionally polished. The "polishing" herein is optionally exemplified by chemical polishing in addition to mechanical polishing. The worker also optionally replaces the furnace internals (e.g. the crucible 22, the heater 23, the heat insulation material 24, and the heat shield 25) with new furnace internals or used ones of the same type used for the same dopant and comparatively short history of usage. The predetermined value is determined to be 0.2 because the monocrystalline silicon 2 was produced in the past when the emissivity ε was 0.2 or more.

The above arrangement eliminates production restriction to improve the productivity when a production ratio of the normal grade monocrystalline silicon 2 is large.

The scope of the invention is not limited by the example shown in the first exemplary embodiment, where the normal grade monocrystalline silicon 2 is produced when the emissivity ε is more than 0.4 and the low-resistivity grade monocrystalline silicon 2 is produced when the emissivity ε is 0.4 or less. For instance, when the emissivity ε is more than 0.4, either the normal grade or low-resistivity grade monocrystalline silicon 2 is produced in accordance with the production plan and the low-resistivity grade monocrystalline silicon 2 is produced when the emissivity ε is 0.4 or less.

The above arrangement allows improvement in the productivity when a production ratio of the low-resistivity grade monocrystalline silicon 2 is large.

The main chamber 31, which is exemplarily a cylindrical component whose bottom side is closed in the first exemplary embodiment, is not necessarily a cylindrical component whose bottom side is closed. For instance, the main chamber 31 is optionally separable into a disc-shaped component (base chamber) and a cylindrical component.

The heat shield 25 and the top chamber 32, between which no component is interposed in the first exemplary embodiment, are not necessarily configured as in the first exemplary embodiment. For instance, a cylindrical purge tube surrounding the monocrystalline silicon 2 is optionally provided between the heat shield 25 and the top chamber 32. With the above arrangement, a flow of gas introduced into the furnace body 21 can be controlled and the amount of deposits adhered to the inner wall surface of the top chamber 32 can be reduced.

Further, magnetic field applied Czochralski method is optionally used to produce the monocrystalline silicon 2 according to the same process as described in the first exemplary embodiment. In this case, a pair of electromagnetic coils facing across the crucible 22 are optionally provided outside the main chamber 31 shown in FIG. 1 to restrain natural convection of the dopant-added melt MD by applying a horizontal magnetic field.

What is claimed is:

1. A production method of monocrystalline silicon using a monocrystalline silicon production machine comprising: a crucible configured to store a dopant-added melt comprising a silicon melt added with an n-type dopant in a form of arsenic, phosphorus, or antimony; a main chamber that houses the crucible; and a top chamber that covers an upper side of the main chamber, wherein
   a resistivity of the monocrystalline silicon is from 1.5 mΩ·cm to 25 mΩ·cm when the dopant is arsenic, from 0.5 mΩ·cm to 25 mΩ·cm when the dopant is phosphorus, and from 8 mΩ·cm to 40 mΩ·cm when the dopant is antimony,
   the method comprising:
      measuring an emissivity of an inner wall surface of the top chamber; and
      determining a target resistivity of the monocrystalline silicon based on the emissivity measured in the measuring, thereby producing the monocrystalline silicon, wherein
   in determining the target emissivity on a crystal center axis at a position for starting a formation of a straight body of the monocrystalline silicon in the producing, when the emissivity is equal to or less than a first reference value, the target resistivity is determined to be less than a predetermined set resistivity,
   the first reference value of the emissivity is 0.4, and
   the predetermined set resistivity is 3.0 mΩ·cm when the dopant is arsenic, 1.7 mΩ·cm when the dopant is phosphorus, and 15 mΩ·cm when the dopant is antimony.

2. A production method of monocrystalline silicon using a monocrystalline silicon production machine comprising: a crucible configured to store a dopant-added melt comprising a silicon melt added with an n-type dopant in a form of arsenic, phosphorus, or antimony; a main chamber that houses the crucible; and a top chamber that covers an upper side of the main chamber, wherein
   a resistivity of the monocrystalline silicon is from 1.5 mΩ·cm to 25 mΩ·cm when the dopant is arsenic, from 0.5 mΩ·cm to 25 mΩ·cm when the dopant is phosphorus, and from 8 mΩ·cm to 40 mΩ·cm when the dopant is antimony,
   the method comprising:
      measuring an emissivity of an inner wall surface of the top chamber; and
      determining a target resistivity of the monocrystalline silicon based on the emissivity measured in the measuring, thereby producing the monocrystalline silicon, wherein
   in determining the target emissivity on a crystal center axis at a position for starting a formation of a straight body of the monocrystalline silicon in the producing, when the emissivity is more than a first reference value and 0.8 or less, the target resistivity is determined to be equal to or more than a predetermined set resistivity,
   the first reference value of the emissivity is 0.4, and
   the predetermined set resistivity is 3.0 mΩ·cm when the dopant is arsenic, 1.7 mΩ·cm when the dopant is phosphorus, and 15 mΩ·cm when the dopant is antimony.

3. The production method of monocrystalline silicon according to claim 1, further comprising cleaning the inner wall surface of the top chamber before the measuring.

4. The production method of monocrystalline silicon according to claim 1, wherein, when the emissivity is less than a second reference value less than the first reference value, the top chamber is replaced or the inner wall surface of the top chamber is polished.

5. The production method of monocrystalline silicon according to claim 4, wherein the second reference value of the emissivity is 0.2.

6. The production method of monocrystalline silicon according to claim 2, further comprising cleaning the inner wall surface of the top chamber before the measuring.

7. The production method of monocrystalline silicon according to claim 2, wherein, when the emissivity is less than a second reference value less than the first reference value, the top chamber is replaced or the inner wall surface of the top chamber is polished.

8. The production method of monocrystalline silicon according to claim 7, wherein the second reference value of the emissivity is 0.2.

* * * * *